US 6,642,536 B1

(12) United States Patent
Xiang et al.

(10) Patent No.: US 6,642,536 B1
(45) Date of Patent: Nov. 4, 2003

(54) HYBRID SILICON ON INSULATOR/BULK STRAINED SILICON TECHNOLOGY (75) Inventors: Qi Xiang, San Jose, CA (US); Akif Sultan, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/015,802

(22) Filed: Dec. 17, 2001

(51) Int. Cl.$^7$ .................. H01L 29/06; H01L 31/0328; H01L 31/0336; H01L 31/072; H01L 31/109
(52) U.S. Cl. .................. 257/19; 257/20; 257/347; 257/348
(58) Field of Search .............. 257/17, 18, 19, 257/347–354

(56) References Cited

U.S. PATENT DOCUMENTS

| | | | | |
|---|---|---|---|---|
| 5,440,152 A | * | 8/1995 | Yamazaki | 257/197 |
| 5,476,813 A | * | 12/1995 | Naruse | 437/132 |
| 5,759,898 A | | 6/1998 | Ek et al. | |
| 5,847,419 A | * | 12/1998 | Imai et al. | 257/192 |
| 6,039,803 A | | 3/2000 | Fitzgerald et al. | |
| 6,059,895 A | * | 5/2000 | Chu et al. | 438/47 |

(List continued on next page.)

OTHER PUBLICATIONS

Shallow Trench Isolation, "Trench Isolation," http://courses.nus.edu.sg/course/phy/>, pp. 1–4.
Hitachi America, Ltd. Semiconductor Equipment Group, "Customizable Shallow Trench Isolation," http://www.hitachi.com/semiequipment/sti.html/>, p. 1.
SNP Applications/Shallow Trench Isolation (STI), "Shallow Trench Isolation (STI)," http://www.surfaceinterface.com/snpappsSTI.html/>, pp. 1–2.
Institute of Microelectronics—Deep Submicron—Shallow Trench Isolation, "Shallow Trench Isolation Module Development," http://www.ime.org.sg/deep_trench.htm/>, pp. 1–2.
Journal of the Electrocemical Society, vol. 142, No. 3, Mar. 1995.
David Lammers, "MIT spinout preps commercial strained silicon,", Oct. 22, 2001, http://www.eetimes.com/story/OEG20011022S0078/>, pp. 1–5.
IBM's Strained Silicon Breakthrough Image Page, Jun. 8, 2001, http://www.research.ibm.com/resources/press/strainedsilicon/>, pp. 1–2.
Dennis Sellers, "It isn't just IBM that has 'strained silicon' technology,", Jun. 14, 2001, http://maccentral.macworld.com/news/0106/14.silicon.shtml/>, pp. 1–5.
Matthew French, "AmberWave System' strained silicon significant for semiconductor industry," Aug. 6, 2001, http://www.mass . . . /displaydetail.asp?/>, pp. 1–3.
Richard Ball, "Strained silicon wafers boost FET speed 80 per cent at US start–up," Electronics Weekly Archive, p. 1.
Orla Higgins, Press Release, "AmberWave Systems Corporation Announces Availability of Breakthrough Strained Silicon Technology," Oct. 22, 2001, pp. 1–4.
Mark A. Wolf, Press Release , Amberwave Announces Strained Silicon Technology Available Immediately, Jun. 8, 2001, p. 1.

Primary Examiner—Eddie Lee
Assistant Examiner—Jesse A. Fenty (57) ABSTRACT

Silicon on insulator technology and strained silicon technology provide semiconductor devices with high performance capabilities. Shallow trench isolation technology provides smaller devices with increased reliability. Bulk silicon technology provides devices requiring deep ion implant capabilities and/or a high degree of thermal management. A semiconductor device including silicon on insulator regions, strained silicon layer, shallow trench isolation structures, and bulk silicon regions is provided on a single semiconductor substrate.

13 Claims, 6 Drawing Sheets

U.S. PATENT DOCUMENTS

| | | |
|---|---|---|
| 6,180,490 B1 | 1/2001 | Vassiliev et al. |
| 6,207,530 B1 | 3/2001 | Hsu et al. |
| 6,214,653 B1 | 4/2001 | Chen et al. |
| 6,251,751 B1 | 6/2001 | Chu et al. |
| 6,300,172 B1 | 10/2001 | Ang et al. |
| 6,313,486 B1 | 11/2001 | Kencke et al. |
| 6,410,395 B1 * | 6/2002 | Terpstra et al. ............. 438/312 |
| 6,429,091 B1 * | 8/2002 | Chen et al. ................. 438/423 |
| 2001/0003269 A1 | 6/2001 | Wu et al. |
| 2001/0008284 A1 * | 7/2001 | Huang ......................... 257/66 |
| 2001/0016383 A1 | 8/2001 | Chen et al. |
| 2001/0024884 A1 | 9/2001 | Fitzgerald |
| 2002/0030203 A1 * | 3/2002 | Fitzgerald ................... 257/194 |
| 2002/0030227 A1 * | 3/2002 | Bulsara et al. .............. 257/346 |

\* cited by examiner

HYBRID SILICON ON INSULATOR/BULK STRAINED SILICON TECHNOLOGY

TECHNICAL FIELD

The present invention relates to the field of manufacturing semiconductor devices and, more particularly, to an improved semiconductor device comprising silicon on insulator (SOI) and bulk silicon technology.

BACKGROUND OF THE INVENTION

An important aim of ongoing research in the semiconductor industry is increasing semiconductor performance while decreasing power consumption in semiconductor devices. Planar transistors, such as metal oxide semiconductor field effect transistors (MOSFET) are particularly well suited for use in high-density integrated circuits. As the size of MOSFET and other devices decrease, the dimensions of source/drain regions channel regions, and gate electrodes of the devices, also decrease.

The design of ever-smaller planar transistors with short channel lengths makes it necessary to provide very shallow source/drain junctions. Shallow junctions are necessary to avoid lateral diffusion of implanted dopants into the channel, since such diffusion disadvantageously contributes to leakage currents and poor breakdown performance. Shallow source/drain junctions, on the order of 1,000 Å or less thick, are generally required for acceptable performance in short channel devices.

Silicon on insulator (SOI) technology allows the formation of high-speed, shallow-junction devices. In addition, SOI devices improve performance by reducing parasitic junction capacitance. Although, SOI technology improves the performance of shallow-junction devices, devices that require deeper junctions do not benefit from SOI. For example, devices which are temperature sensitive or which require a deep implant perform better when formed in the bulk substrate.

Strained silicon technology also allows the formation of higher speed devices. Strained-silicon transistors are created by depositing a graded layer silicon germanium (SiGe) on a bulk silicon wafer. A thin layer of silicon is subsequently deposited on the SiGe. The distance between atoms in the SiGe crystal lattice is greater than the distance between atoms in an ordinary silicon crystal lattice. Because there is a natural tendency of atoms inside different crystals to align with one another when one crystal is formed on another crystal, when silicon is deposited on top of SiGe the silicon atoms tend to stretch or "strain" to align with the atoms in the SiGe lattice. Electrons in the strained silicon experience less resistance and flow up to 80% faster than in ordinary crystalline silicon.

Shallow trench isolation (STI) provides another technique to shrink device size. The use of STI significantly shrinks the area needed to isolate transistors better than local oxidation of silicon (LOCOS). STI also provides superior latch-up immunity, smaller channel width encroachment, and better planarity. The use of STI techniques eliminates the bird's-beak frequently encountered with LOCOS.

The term semiconductor devices, as used herein, is not to be limited to the specifically disclosed embodiments. Semiconductor devices, as used herein, include a wide variety of electronic devices including flip chips, flip chip/package assemblies, transistors, capacitors, microprocessors, random access memories, etc. In general, semiconductor devices refer to any electrical device comprising semiconductors.

SUMMARY OF THE INVENTION

There exists a need in the semiconductor device art for a device that combines the performance improvements of SOI technology, STI technology, strained silicon technology, and bulk silicon technology. There exists a need in this art to provide a hybrid semiconductor device that comprises SOI regions and bulk silicon regions formed on a common semiconductor substrate comprising a strained silicon layer.

These and other needs are met by embodiments of the present invention, which provide a semiconductor device comprising a semiconductor substrate comprising a base layer and a silicon germanium (SiGe) layer formed on the base layer. A silicon layer is formed on the SiGe layer, wherein the SiGe layer contains a first region in which an isolation region is formed therein, and a second region. A plurality of field effect transistors (FET) are formed on the substrate, including a first FET formed over the isolation region in the first region and a second FET formed in the second region.

The earlier stated needs are also met by certain embodiments of the instant invention, which provide a semiconductor device comprising a semiconductor device comprising a base layer and an SiGe layer formed on the base layer. A silicon layer is formed on the SiGe layer. An insulating region extends through the silicon layer into the SiGe layer and portions of the insulating region extend alongside and under the silicon layer, and a transistor is formed in a portion of the substrate overlying the isolation region.

The earlier stated needs are also met by certain embodiments of the instant invention, which provide a method of manufacturing semiconductor devices, the method comprising providing a semiconductor substrate comprising a SiGe layer formed over a base layer. A silicon layer is formed over the SiGe layer. A first region and a second region are formed, spaced apart from each other, on the substrate, wherein the first region comprises an isolation region. A first FET is formed over the isolation region in the first region, and a second FET is formed in the second region.

This invention addresses the needs for an improved high-speed semiconductor device with improved electrical characteristics.

The foregoing and other features, aspects, and advantages of the present invention will become apparent in the following detailed description of the present invention when taken in conjunction with the accompanying drawings.

DETAILED DESCRIPTION OF THE INVENTION

The present invention enables the production of improved high-speed semiconductor devices with reduced parasitic junction capacitance. The present invention provides the benefits of both SOI and bulk silicon technology. The present invention further provides the higher speed offered by strained silicon technology coupled with the smaller overall device size provided by STI technology. These benefits are provided by combining SOI, STI, strained silicon, and bulk silicon technology on a single substrate.

The invention will be described in conjunction with the formation of the semiconductor device illustrated in the accompanying drawings. However, this is exemplary only as the claimed invention is not limited to the formation of the specific device illustrated in the drawings.

Figure 1:
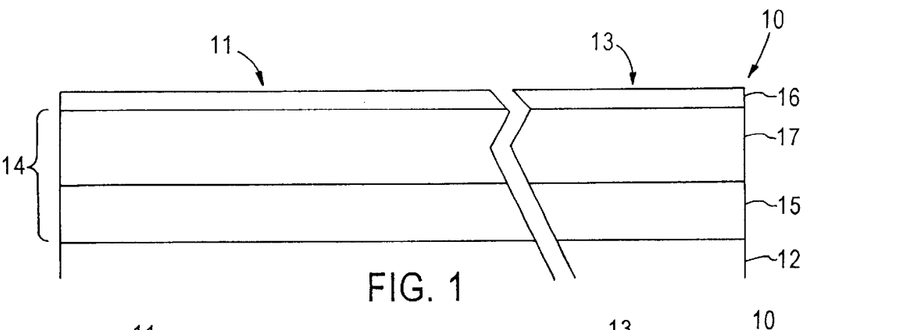
FIGS. 1–14 schematically illustrate the formation of a hybrid SOI/bulk silicon semiconductor device comprising a strained silicon layer.

Semiconductor substrate 10 comprising a first region 11 and a second region 13 is provided, as shown in FIG. 1. Semiconductor substrate 10 comprises a base layer 12, such as a silicon wafer, with a SiGe layer 14 formed thereon. A layer of strained silicon 16 is formed over the SiGe layer 14. The base layer 12 is typically a silicon wafer about 100 μm thick. The SiGe layer 14 is formed by a chemical vapor deposition (CVD) process, such as ultra-high vacuum chemical vapor deposition (UHVCVD). The SiGe layer 14 comprises a sublayer 15, in which the concentration of Ge is graded from about 0% Ge at the SiGe layer 14/base layer 12 interface. The concentration is increased as the SiGe sublayer 15 is deposited up to a maximum concentration of about 30% Ge. In certain embodiments the maximum concentration of Ge is about 20% Ge. The thickness of the graded sublayer 15 is about 2 μm. When the maximum desired concentration of Ge is achieved, about a 1 μm to 2 μm thick sublayer of SiGe 17, of substantially constant Ge concentration, is deposited over the graded sublayer of SiGe 15 forming a SiGe layer 14 with an overall thickness of about 3 μm to about 4 μm. The concentration of Ge in the constant concentration sublayer 17 is substantially the same as the maximum Ge concentration in the graded sublayer 15.

The strained silicon layer 16 is an epitaxial layer formed by CVD to a thickness of about 100 Å to about 300 Å. The atoms in the silicon layer 16 stretch apart from each other in order to align themselves with the underlying lattice structure of the SiGe layer. Electron flow in this "strained silicon" layer 16 is much faster than in ordinary crystalline silicon.

Figure 2:
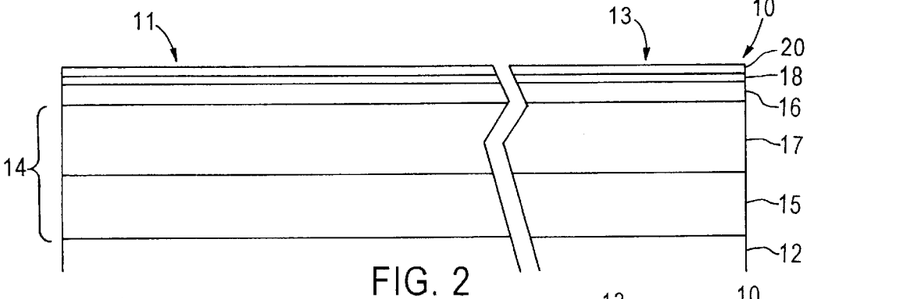

As shown in FIG. 2, a silicon oxide layer 18 and silicon nitride layer 20 are subsequently formed over the strained silicon layer 16. The silicon oxide layer 18 is about 100 Å to about 200 Å thick and the silicon nitride layer 20 is about 1000 Å to about 2000 Å thick. The oxide 18 and nitride 20 layers can be formed by conventional means, such as by CVD.

Figure 3:
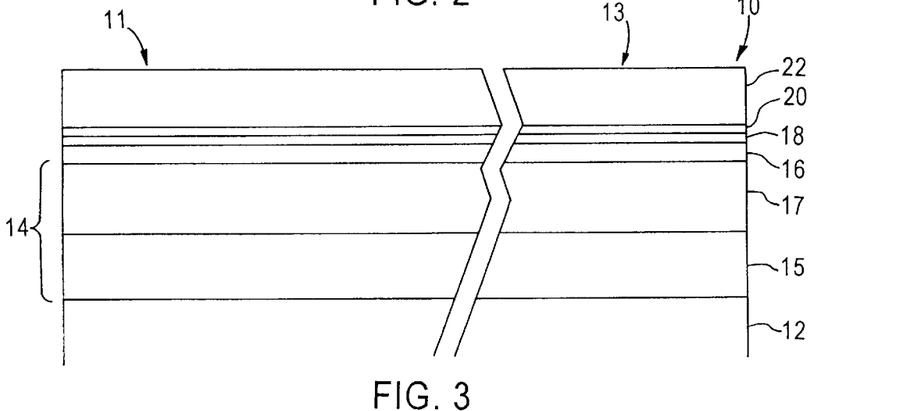
Figure 4:
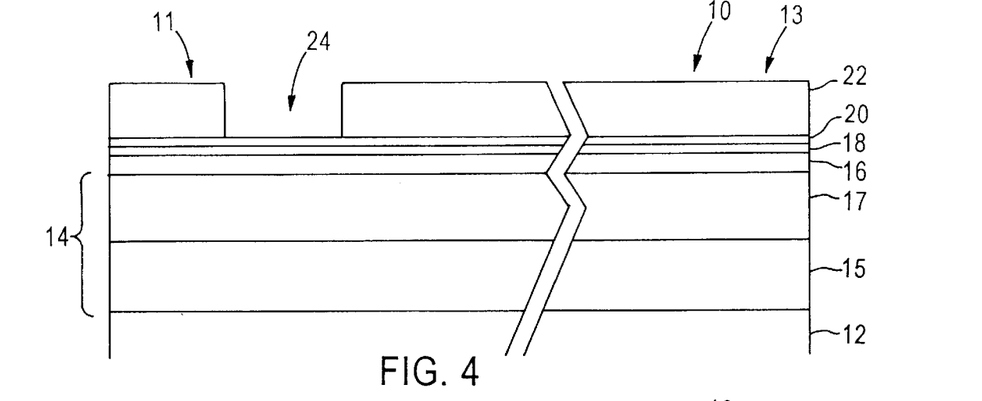
Figure 5:
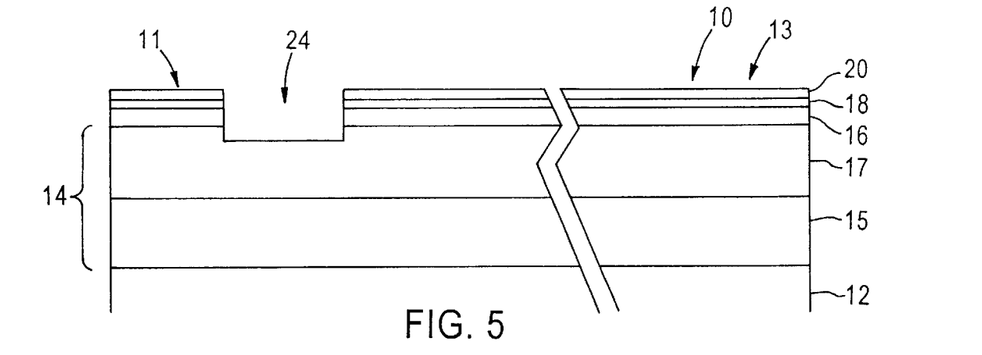

A resist layer 22 comprising a conventional photoresist is formed over substrate 10, as shown in FIG. 3. The resist layer 22 is subsequently patterned using conventional photolithographic techniques to form a trench 24 in the first region 11 of the semiconductor substrate 10, as shown in FIG. 4. The trench 24 is extended through the silicon nitride layer 20, silicon oxide layer 18, strained silicon layer 16, and into the SiGe layer 14 using an anisotropic etch, and the photoresist layer 22 is stripped. The anisotropic etch is performed using conventional techniques, such as plasma etching. The anisotropic etch can be carried out in a series of plasma etching steps using different known plasmas that optimally etch the various different layers.

Figure 6:
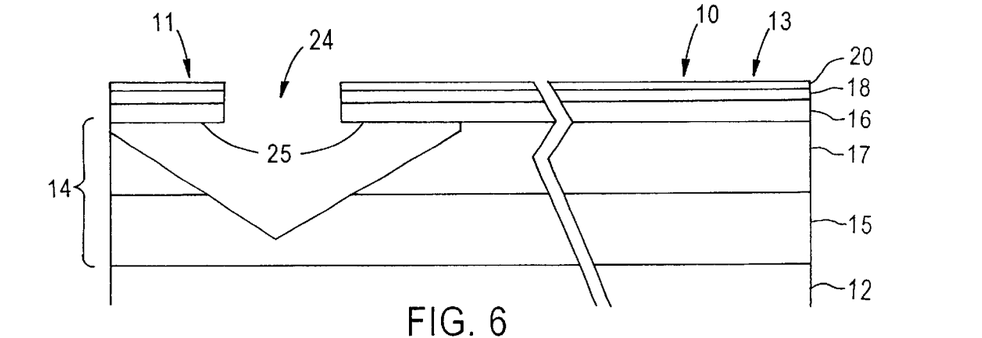

The trench 24 is subsequently enlarged, undercutting the silicon layer 16 by isotropic etching. FIG. 6 schematically illustrates the enlarging of trench 24. In certain embodiments of the instant invention, an isotropic wet etchant, such as a mixture of hydrofluoric acid (HF), hydrogen peroxide ($H_2O_2$), and acetic acid ($CH_3COOH$) that selectively etches SiGe is used to form the undercut regions 25. For example, a 1:2:3 by volume solution of HF/ $H_2O_2$/$CH_3COOH$ is an effective etchant in certain embodiments of the instant invention. The HF/ $H_2O_2$/$CH_3COOH$ etchant is highly-selective and can etch SiGe up to 300 times faster than silicon. Isotropic etching is continued to enlarge the trench 24 to a maximum depth of about 1000 Å to about 6000 Å and a maximum width of about 1000 Å to about 6000 Å.

Figure 7:
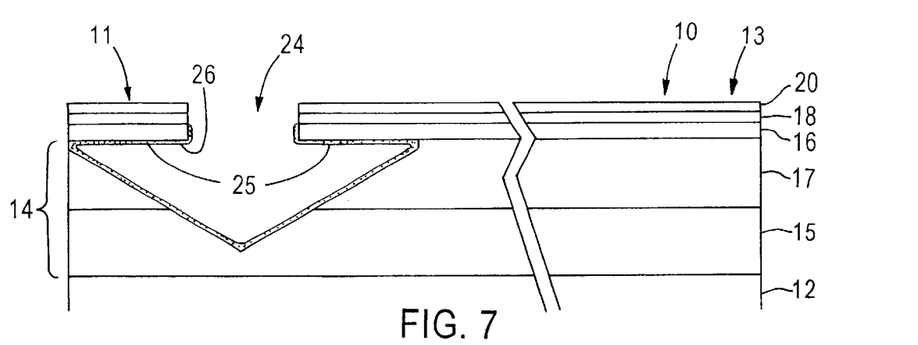

After enlarging the trench 24, a liner oxide layer 26 is formed, as shown in FIG. 7. Oxide liner layer 26 is a thermal oxide liner grown to a thickness of about 30 Å to about 100 Å. The thermal oxide liner layer 26 is grown by conventional methods, such as by exposing the semiconductor substrate 10 to an oxygen ambient at a temperature of approximately 950° C. to about 1100° C.

Figure 8:
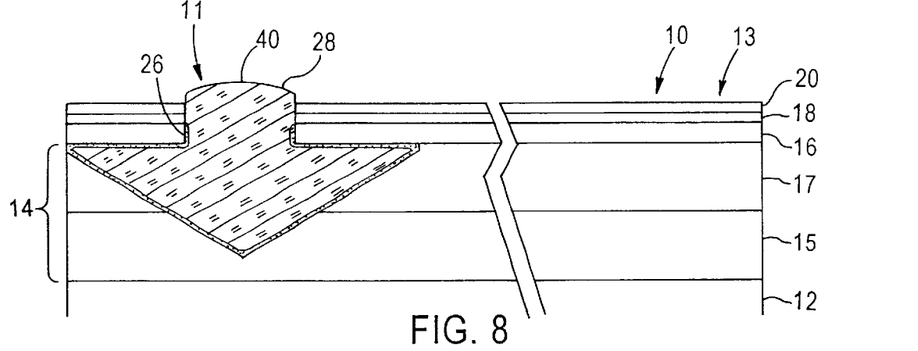

The trench 24 is subsequently filled with a suitable insulating material 28 by a conventional CVD process. Suitable insulating materials 28 include silicon nitride and silicon oxide. Typically, trench 24 is filled with silicon oxide 28 to form isolation region 40, as shown in FIG. 8. The process forming isolation region 40 is known as shallow trench isolation (STI). Some of the conventional methods of filling trench 24 include: a) tetraethylorthosilicate low pressure chemical vapor deposition (TEOS LPCVD), b) non-surface sensitive TEOS ozone atmospheric or sub-atmospheric pressure chemical vapor deposition (APCVD or SACVD), and c) silane oxidation high-density plasma CVD.

Because of the relatively narrow opening in the trench 24 and the extensive undercut regions 25, voids may develop when the trench 24 is filled with an insulating material 28 such as silicon oxide. In order to alleviate void formation, the silicon oxide 28 can be densified by thermally annealing the deposited silicon oxide 28 at high temperature.

Figure 9:
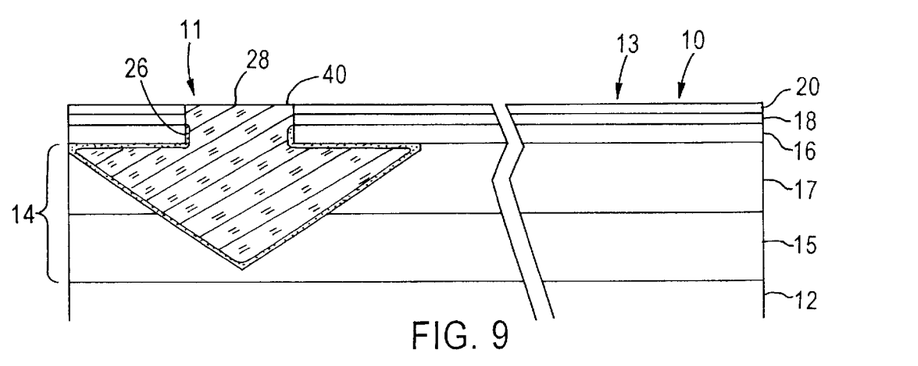
Figure 10:
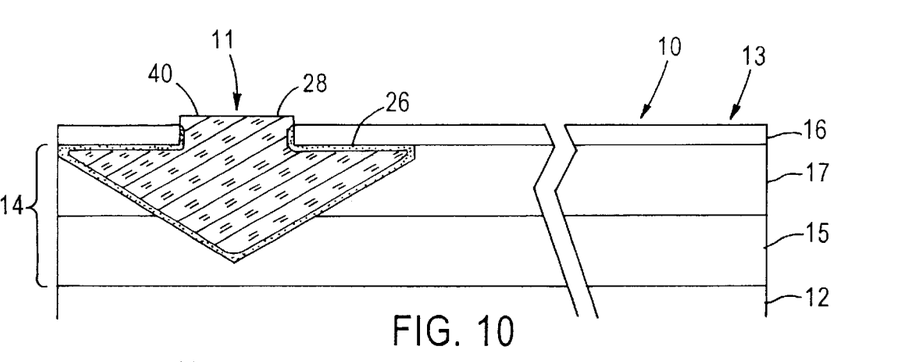

Semiconductor substrate 10 is planarized, as shown in FIG. 9, by chemical method mechanical polishing (CMP). After planarizing, nitride layer 20 and oxide layer 18 are subsequently removed. Nitride layer 20 and oxide layer 18 are typically removed by wet etching. Hot phosphoric acid is conventionally used to etch silicon nitride and hydrofluoric acid or a mixture of hydrofluoric acid and ammonium fluoride (buffered oxide etch) is used to remove the oxide layer, to provide the structure as shown in FIG. 10.

Figure 11:
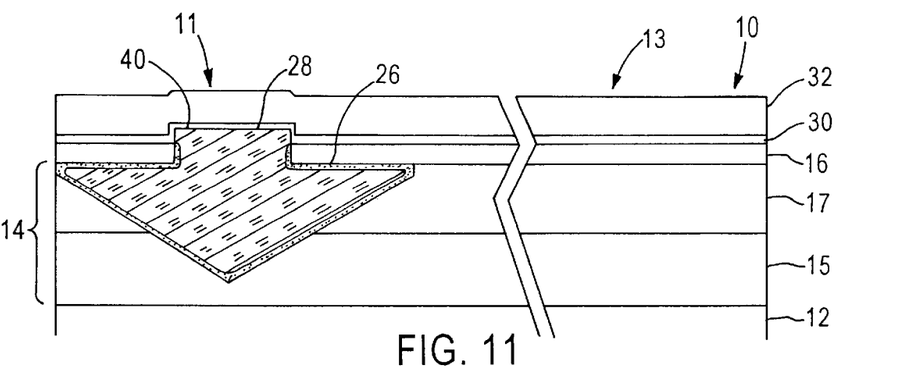

After the isolation region 40 is formed in the first region 11, field effect transistors (FET) are formed in the first region II and the second region 13 of semiconductor substrate 10. Gate oxide layer 30 and gate electrode 32 are formed over conductive substrate 10, as shown in FIG. 11. Gate oxide layer 30 is formed to a thickness of about 10 Å to about 100 Å by either CVD or by thermal oxidation of a portion of the silicon layer 16. The gate electrode layer 32 is formed by depositing polysilicon to a thickness of about 100 nm to about 300 nm.

Figure 12:
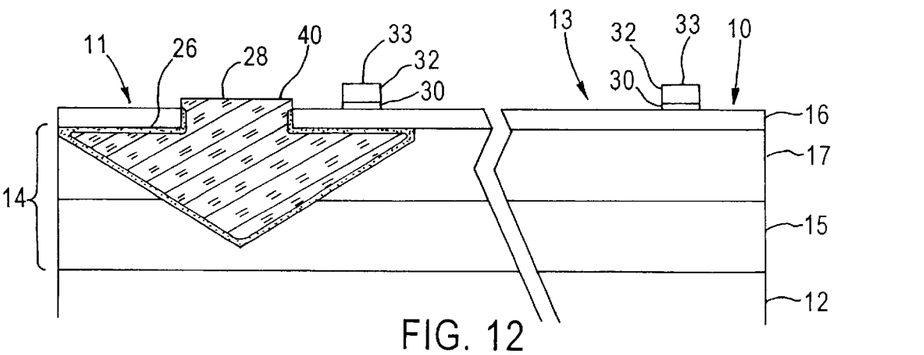
Figure 13:
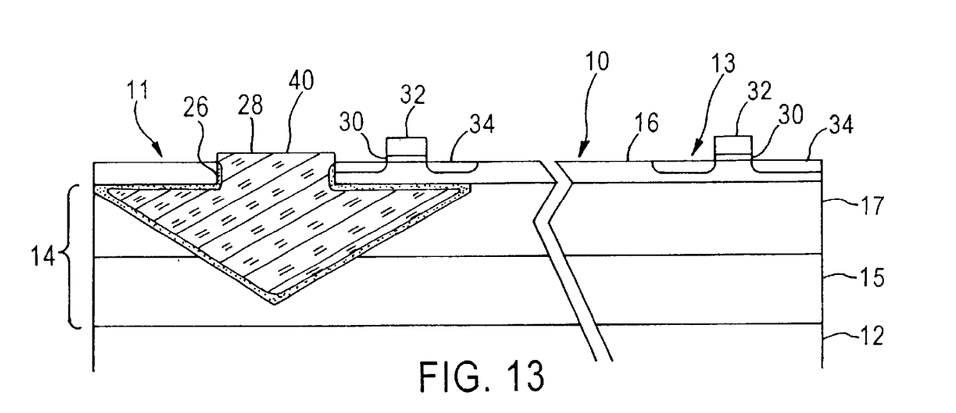
Figure 14:
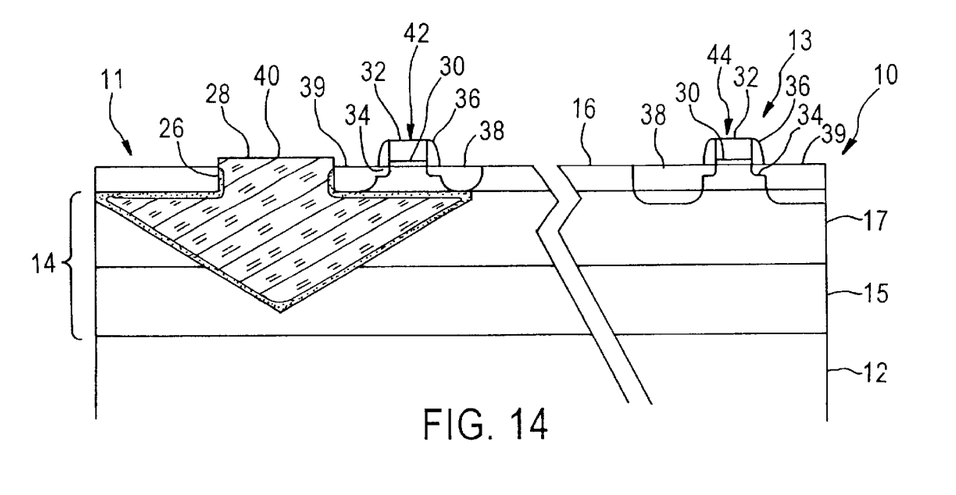

The structure of FIG. 11 is subsequently masked and patterned, such as by conventional photolithographic patterning, and the gate oxide layer 30 and gate electrode layer 32 are etched to form gate electrode structures 33, as shown in FIG. 12. As shown in FIG. 13, source and drain extensions 34 are formed in first region 11 and the second region (bulk region) 13 by ion implantation. Sidewall spacers 36, as shown in FIG. 14, are subsequently formed on the gate electrode structures 33 by depositing a layer of insulating material, such as silicon nitride or silicon oxide followed by anisotropic etching to form the sidewalls 36. Source and drain regions 38 are subsequently formed by conventional techniques such as ion implantation, and then annealed to form the source and drain regions 38 with lightly doped drain extensions 34 and heavily doped regions 39. As shown in FIGS. 11 to 14, a first FET 42 and a second FET 44 are formed substantially simultaneously in this exemplary embodiment.

Figure 15:
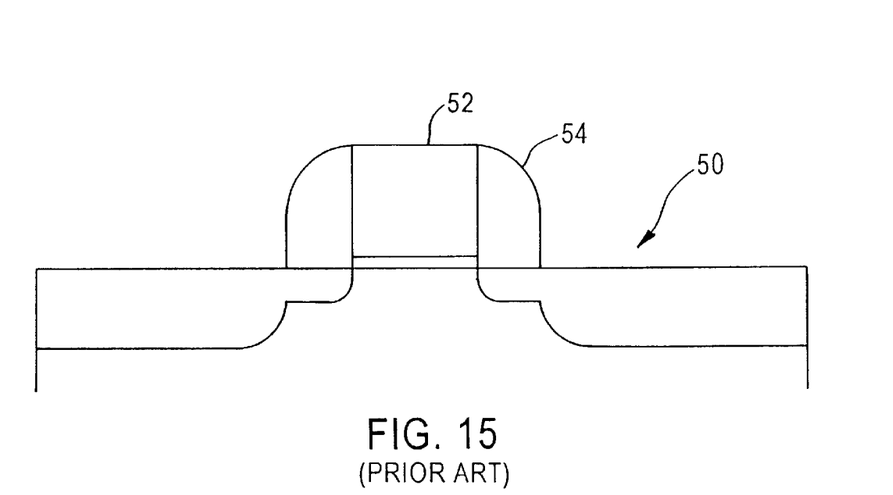
FIG. 15 schematically illustrates a conventional field effect transistor.
Figure 16:
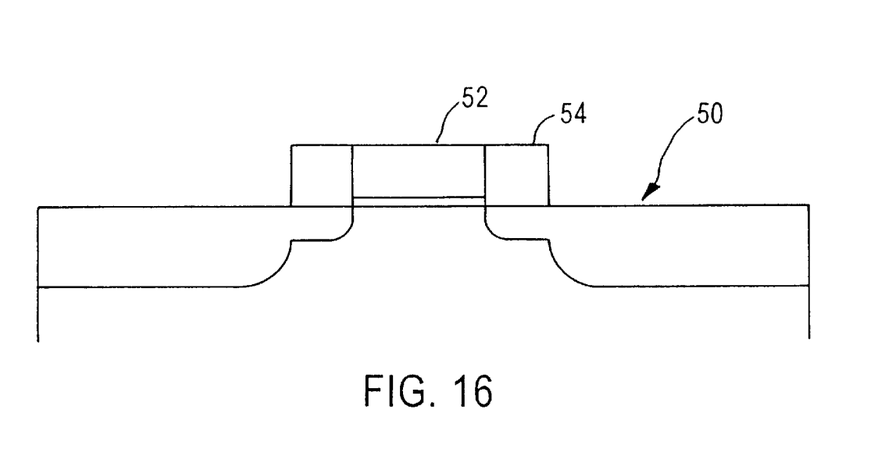
FIG. 16 schematically illustrates a field effect transistor with a planarized gate and sidewall spacers.

In certain embodiments, a semiconductor device 50 with planarized FET transistor gates 52 and sidewall spacers 54 are produced by chemical-mechanical polishing. FIGS. 15 and 16 illustrate the semiconductor device 50 before and after chemical-mechanical polishing.

The methods of the present invention provide an improved semiconductor device with the high-speed capabilities of silicon on insulator and strained silicon technologies, the high reliability and smaller dimension capabilities of shallow trench isolation, and the favorable high temperature operating characteristics and deep ion implants of bulk silicon technology. The present invention provides the above benefits in a semiconductor device formed on a single substrate.

The embodiments illustrated in the instant disclosure are for illustrative purposes only. They should not be construed to limit the claims. As is clear to one of ordinary skill in the art, the instant disclosure encompasses a wide variety of embodiments not specifically illustrated herein.

What is claimed is:

1. A semiconductor device comprising:
   a semiconductor substrate comprising a base layer,
   a silicon germanium (SiGe) layer formed on the base layer;
   a silicon layer formed on the SiGe layer, wherein the SiGe layer contains a first T region in which an isolation region is formed therein, and a second region;
   a plurality of field effect transistors (FET) including a first FET formed over the isolation region in the first region; and
   a second FET formed in the second region, wherein the isolation region comprises undercut portions in contact with the silicon layer and the undercut portions extend alongside and directly below the silicon layer.

2. The semiconductor device of claim 1, wherein the isolation region does not extend into the second region.

3. The semiconductor device of claim 1, wherein the isolation region comprises a shallow trench isolation structure.

4. The semiconductor device of claim 1, wherein the isolation region extends under the silicon layer in the first region.

5. The semiconductor device of claim 1, wherein the SiGe layer comprises a first sublayer wherein the composition of the first sublayer is graded from about 0% Ge at the SiGe layer/base layer interface up to about 30% Ge.

6. The semiconductor device of claim 5, wherein the SiGe layer further comprises a second sublayer of SiGe with a substantially constant Ge concentration overlying the first sublayer of SiGe.

7. The semiconductor device of claim 1, wherein said silicon layer comprises strained silicon.

8. A semiconductor device comprising:
   a semiconductor substrate comprising a base layer,
   a silicon germanium (SiGe) layer formed on the base layer;
   a silicon layer formed on the SiGe layer, wherein the SiGe layer contains a first region in which an isolation region is formed therein, and a second region;
   a plurality of field effect transistors (FET) including a first FET formed over the isolation region in the first region; and
   a second FET formed in the second region, wherein the first FET and the second FET comprise source and drain regions, and the source and drain regions of said first FET are confined to the silicon layer.

9. The semiconductor device of claim 8, wherein the source and drain regions of the second FET extend into the SiGe layer.

10. A semiconductor device comprising:
    a semiconductor substrate comprising a base layer,
    a SiGe layer formed on the base layer,
    a silicon layer formed on the SiGe layer,
    an isolation region extending through the silicon layer into the SiGe layer, and
    a transistor formed on a portion of the substrate overlying the isolation region, wherein the isolation region comprises undercut portions in contact with the silicon layer and the undercut portions extend alongside and directly below the silicon layer.

11. The semiconductor device of claim 10, wherein said transistor is a FET comprising
    source and drain regions formed in the silicon layer and
    a gate electrode overlying the silicon layer and the isolation region.

12. The semiconductor device of claim 10, wherein said SiGe layer comprises a first sublayer comprising a graded concentration of Ge and a second sublayer comprising a substantially constant Ge concentration.

13. The semiconductor device of claim 10, wherein said isolation region is a shallow trench isolation region.

* * * * *